United States Patent [19]
Cheng et al.

[11] Patent Number: 5,818,378
[45] Date of Patent: Oct. 6, 1998

[54] CABLE LENGTH ESTIMATION CIRCUIT USING DATA SIGNAL EDGE RATE DETECTION AND ANALOG TO DIGITAL CONVERSION

[75] Inventors: Yi Cheng, San Jose; Zhenhua Liu, Sunnyvale; Thomas Jefferson Ronaldue, San Jose, all of Calif.

[73] Assignee: Advanced Micro Devices, Inc., Sunnyvale, Calif.

[21] Appl. No.: 872,272

[22] Filed: Jun. 10, 1997

[51] Int. Cl.[6] .............................. H04B 10/14; H03M 1/00
[52] U.S. Cl. .............................. 341/155; 333/18; 375/229
[58] Field of Search ........................... 341/155; 375/229; 333/18; 324/522

[56] References Cited

U.S. PATENT DOCUMENTS

| | | | |
|---|---|---|---|
| 3,728,649 | 4/1973 | Waldhauer | 333/18 |
| 4,413,240 | 11/1983 | Dyke . | |
| 5,293,405 | 3/1994 | Gersbach . | |
| 5,530,365 | 6/1996 | Lefeldt | 324/536 |
| 5,668,488 | 9/1997 | Sharpe-Geisler et al. | 327/108 |
| 5,764,695 | 6/1998 | Nagaraj et al. | 375/272 |

FOREIGN PATENT DOCUMENTS

| | | | |
|---|---|---|---|
| 0 163 482 | 12/1985 | European Pat. Off. | H04B 3/10 |
| 0 656 694 | 6/1995 | European Pat. Off. | H04B 3/14 |
| 31 48 242 | 6/1983 | Germany | H04N 7/10 |
| 95/05030 | 2/1995 | WIPO | H03H 7/30 |

*Primary Examiner*—Howard L. Williams
*Attorney, Agent, or Firm*—Fliesler, Dubb, Meyer & Lovejoy

[57] ABSTRACT

A cable length estimation circuit for receiving an input MLT-3 signal provided through an arbitrary length cable and providing a control signal to an equalizer indicating the estimated length of the cable enabling the equalizer to compensate for distortion of the MLT-3 signal resulting from the cable. The cable length estimation circuit includes an edge rate detection circuit for measuring the rate of change in voltage with respect to time during transitions of the MLT-3 signal to provide an indication of cable length. The cable length estimation circuit can also include a digital averaging circuit which provides an average value for signals from the edge rate detection circuit for a desired number of transitions of the MLT-3 signal. The cable length estimation can also include a baseline wander detection circuit which functions so that previous cable length estimations are provided when baseline wander is detected.

8 Claims, 6 Drawing Sheets

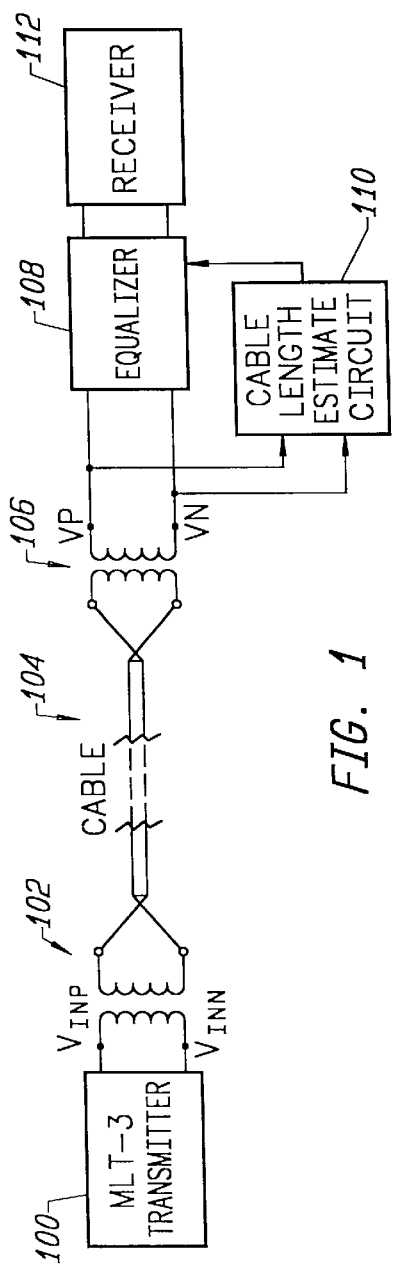
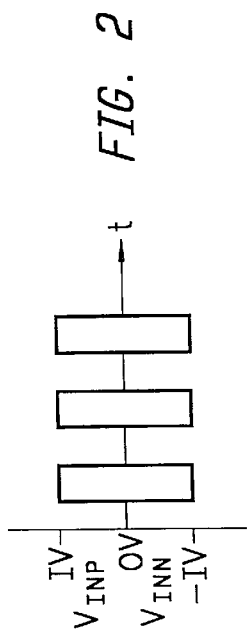
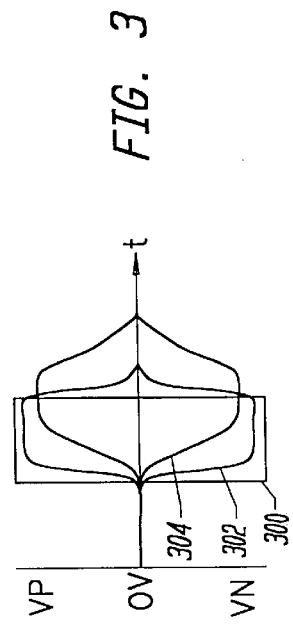
FIG. 1
FIG. 2
FIG. 3

CABLE LENGTH ESTIMATION CIRCUIT USING DATA SIGNAL EDGE RATE DETECTION AND ANALOG TO DIGITAL CONVERSION

BACKGROUND OF THE INVENTION

1. Field of the Invention

The present invention relates to a method for estimating a length of cable providing a signal to a receiving station in a data communication system to enable compensation for loss and phase delay in the signal caused by the cable.

2. Description of the Related Art

As generally know in the art of data communications systems, when a transmitter sends analog or digital signals over a transmission medium such as a transmission line or cable to a receiver, the received signals may become distorted due to attenuation and phase delay resulting when the signals are transmitted through the transmission line.

For example, a 100BaseT Ethernet receiver (following the Ethernet standard ANSI/IEEE Std. 802.3u) must be able to receive a three-level analog signal (MLT-3) at the rate of 125 megabits per second. However, bit error rate for such an Ethernet receiver is related to signal distortion introduced to a received signal by a transmission line, and such distortion will vary depending on the length of transmission line utilized. A signal can be provided to an Ethernet receiver which follows the Ethernet standard ANSI/IEEE Standard 802.3u through a transmission line which may have one of several different lengths. In order to compensate for the signal distortion introduced by a transmission line, signals are typically corrected before being provided to an Ethernet receiver by passing the signals through an equalizer circuit which makes corrections to the input signal for amplitude losses and phase delay introduced by a transmission line.

A typical equalizer circuits include a compensating filter which restores amplitude and phase delay to a signal caused by a cable by having a gain and phase shift controlled by a received control signal. The control signal is typically provided by circuitry utilizing feedback from the equalizer.

One typical control circuit includes a non-linear device, such as a diode, receiving feedback from the compensating filter output. The diode is connected to a passive frequency selective network which functions such that the frequency response of the compensating filter varies in a proportional manner to that of the dynamic resistance of the diode to enable accurate compensation for amplitude losses and phase delay of a cable. The wide range of RC time constants of cables, and vastly differing diode resistances prevent manufactures from integrating this type of control circuit with an equalizer on a single monolithic die.

Another control circuit using feedback from an equalizer uses a set of high-pass basis functions that may be weighted and summed. By adjusting the weights, the compensating circuit can be adapted to accurately control the equalizer to compensate for distortion caused by various cable lengths. Three fixed weighting terms for a particular cable length are typically set by a ratio of resistances coupled to the equalizer output. This structure assumes that the variations of the RC time constant controlled by varying the resistances will be roughly equivalent to a shift in RC time delay resulting from a cable length, and the assumption will apply as long as the ratios of resistances remain fairly constant over process. Although this technique is satisfactory for shorter cable lengths, the weights are difficult to control to accurately compensate for intermediate and longer cable lengths.

Another control circuit providing a signal to control an equalizer uses a feedforward control technique and is described in U.S. patent application Ser. No. 08/743,082, entitled "System For Adaptive Transmission Line Equalization And MLT-3 To NRZ Data Conversion", filed on Nov. 4, 1996, and incorporated herein by reference. By using a feedforward control, control of compensation for the RC time constant of a cable no longer depends on performance of the equalizer itself.

In application Ser. No. 08/743,082, the feedforward control circuitry includes a peak detector receiving an MLT-3 signal provided to the equalizer, and an analog to digital (A/D) converter connecting the peak detector to a control input of the equalizer. Because amplitude of a MLT-3 signal decreases depending on cable length, the output of the A/D converter effectively provides an estimate cable length. The compensating filter of the equalizer upon receiving the digital control signal then functions to provide a gain and phase delay to compensate for the RC time constant of the cable. Such a feedforward control circuit can be integrated with the equalizer onto a monolithic die, and can further provide accurate compensation with cables having a significant length.

SUMMARY OF THE INVENTION

The present invention provides cable length estimation circuitry for estimating the length of a transmission line or cable utilizing a feedforward control technique.

Using the feedforward control technique, as in application Ser. No. 08/743,082, compensation for the RC time constant in a cable does not depend on performance of the equalizer.

Further, using the feedforward control-technique of the present invention, compensation for the RC time constant of a cable can be made with components integrated with an equalizer onto a monolithic die, and the circuit can function accurately irrespective of cable length.

The present invention is a cable length estimation circuit for receiving an MLT-3 signal provided through an arbitrary length cable and includes an edge rate detection circuit for measuring the rate of change in voltage with respect to time during transitions of the MLT-3 signal to provide a control signal representative of the cable length to an equalizer. By measuring the rate of change in voltage with respect to time of the MLT-3 signal from a cable, as opposed to amplitude as provided by the circuit of U.S. patent application No. 08/743,082, the present invention provides a circuit less sensitive to specific MLT-3 signal data patterns.

To compensate for glitches occurring in the MLT-3 signal, or glitches in values provided from the edge rate detection circuit, the present invention further includes a digital averaging circuit which determines an average value of signals from the edge rate detection circuit for a number of transitions of the MLT-3 signal.

To compensate for baseline wander in the MLT-3 signal, the present invention further includes a baseline wander detection circuit. The baseline wander detection circuit includes circuitry to latch a previous state of the average value received from the digital average circuit to the equalizer when baseline wander is detected.

BRIEF DESCRIPTION OF THE DRAWINGS

Further details of the present invention are explained with the help of the attached drawings in which:

FIG. 1 shows a block diagram of a data communication system illustrating connection of the cable length estimation circuit of the present invention;

FIG. 2 shows an MLT-3 signal provided from a transformer of FIG. 1 before being provided through a cable;

FIG. 3 shows MLT-3 signals as provided through different length cables;

DETAILED DESCRIPTION

Figure 4:
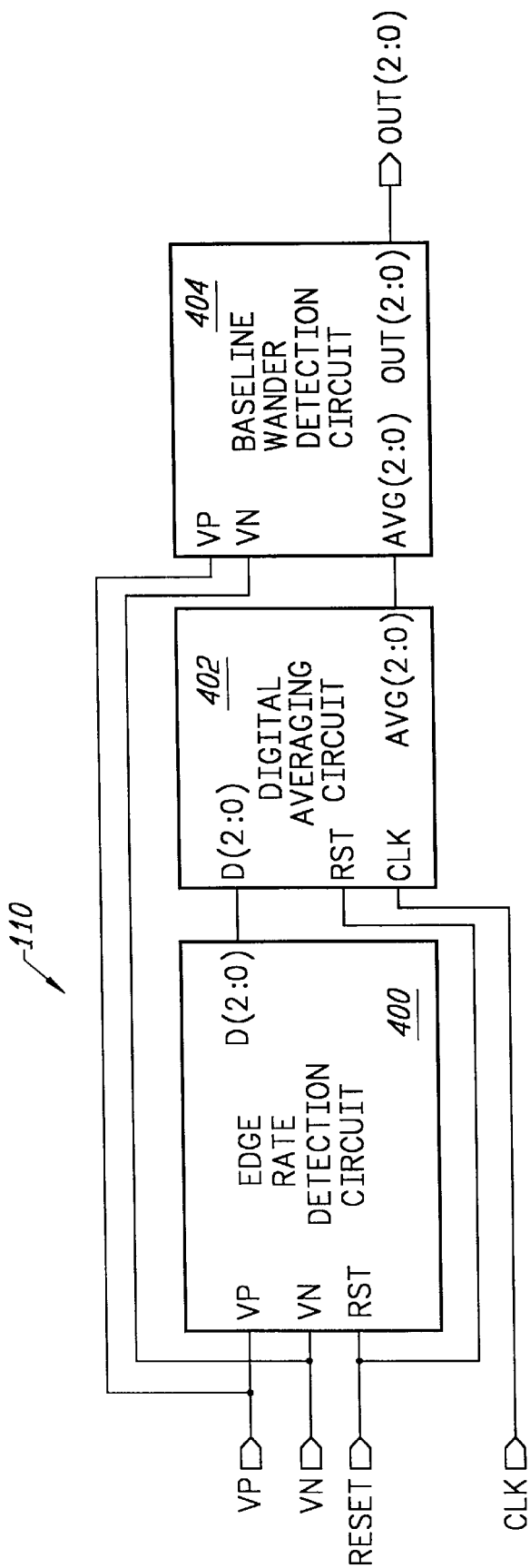
FIG. 4 is a block diagram of circuitry for the cable length estimation circuit of FIG. 1.

FIG. 1 shows a block diagram of a data communication system illustrating connection of the cable length estimation circuit of the present invention. The system includes an MLT-3 Ethernet transmitter 100 which provides a differential MLT-3 signal to transformer 102 at outputs $V_{INP}$ and $V_{INN}$. The differential signal $V_{INP}$, $V_{INN}$ provided by the transmitter 100 is illustrated in FIG. 2. As shown, the signals $V_{INP}$ and $V_{INN}$ are complementary and each transition between 1 volt and –1 volt.

Transformer 102 transmits the received signal through the transmission line, or length of cable 104 connecting to another transformer 106. The transformer 106, then provides a differential signal to equalizer 108 and cable length estimate circuit 110 at differential outputs VP and VN. Although not shown, DC bias circuitry is included to assure the signals VP and VN are received biased to a desired common mode DC voltage level. The cable length estimate circuit 110 provides a cable length estimate to equalizer 108. The equalizer 108, which is made up of a compensation filter with gain and phase shift adjusted by the digital control input provided by circuit 110, and provides the MLT-3 signal corrected for distortion from cable 104 to the Ethernet receiver 112.

FIG. 3 illustrates how the rate of change in voltage with respect to time ($dV_{PN}/dt$) of the differential signals VP and VN is affected when different cable lengths are used. Similar to the signals $V_{INP}$ and $V_{INN}$, the signals VP and VN are complementary and transition between 1 volt and –1 volt less any attenuation through the cable 104. With the cable 104 having no significant length, signals VP and VN illustrated by signal 300 will transition at a rate ($dV_{PN}/dt$) which will not vary significantly from that of signals $V_{INP}$ and $V_{INN}$ as shown in FIG. 2. With an intermediate length cable, the signals VP and VN illustrated by signal 302 will transition at a somewhat lower rate ($dV_{PN}/dt$) than signals $V_{INP}$ and $V_{INN}$. Further, with a longer cable, the signals VP and VN illustrated by signal 304 will transition at a significantly lower rate ($dV_{PN}/dt$) than signals $V_{INP}$ and $V_{INN}$. As can be seen, by measuring a rate ($dV_{PN}/dt$) at transitions of the signals VP and VN, a cable length estimation can be determined.

FIG. 4 shows a block diagram of circuitry for the cable length estimation circuit 110 of FIG. 1. As shown, the cable length estimation circuit 110 includes an edge rate detection circuit 400, a digital averaging circuit 402, and a baseline wander detection circuit 404.

The edge rate detection circuit 400 receives the differential input signals VP and VN which are also input to the equalizer along with a reset signal which is provided upon startup of the cable length estimation circuit 110. The edge rate detection circuit 400 outputs a signal D(2:0) representative of the rate of change in voltage with respect to time ($dV_{PN}/dt$) of the differential input signal VP and VN.

The digital averaging circuit 402 receives the digital signal D(2:0) from the edge rate detection circuit 400, as well as the reset signal (RST) for initializing its output upon startup, and a clock signal (CLK). The digital averaging circuit 402 functions to provide an average value AVG(2:0) representative of an average of the signal values D(2:0) received during a selected number of clock cycles.

The baseline wander detection circuit 404 receives the signal AVG(2:0) from the digital averaging circuit 402, along with the differential signal VP and VN. The baseline wander detection circuit 404 functions to detect baseline wander in the signal VP and VN, and to latch a previous value of the signal AVG(2:0) as its output OUT(2:0) when baseline wander is detected. With no baseline wander detected, the circuit 404 functions to provide the signal AVG(2:0) directly as the signal OUT(2:0). The signal OUT(2:0) provides the control input to the equalizer 108 of FIG. 1.

Figure 5:
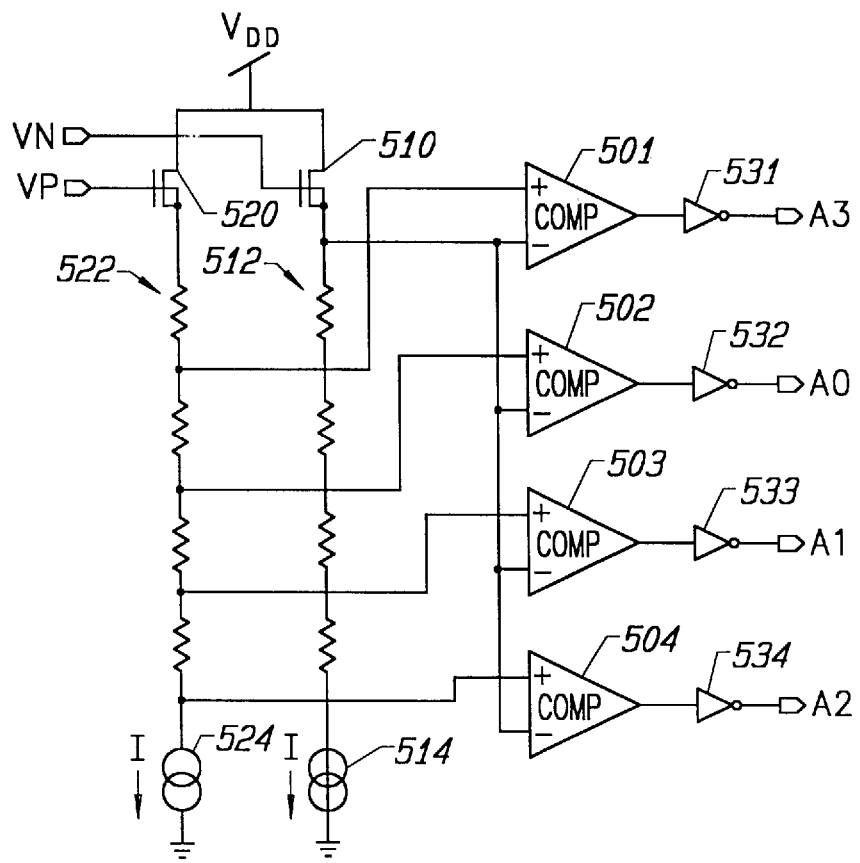
FIG. 5 shows an analog to digital edge rate measurement circuit for the edge rate detection circuit of FIG. 4.
Figure 6:
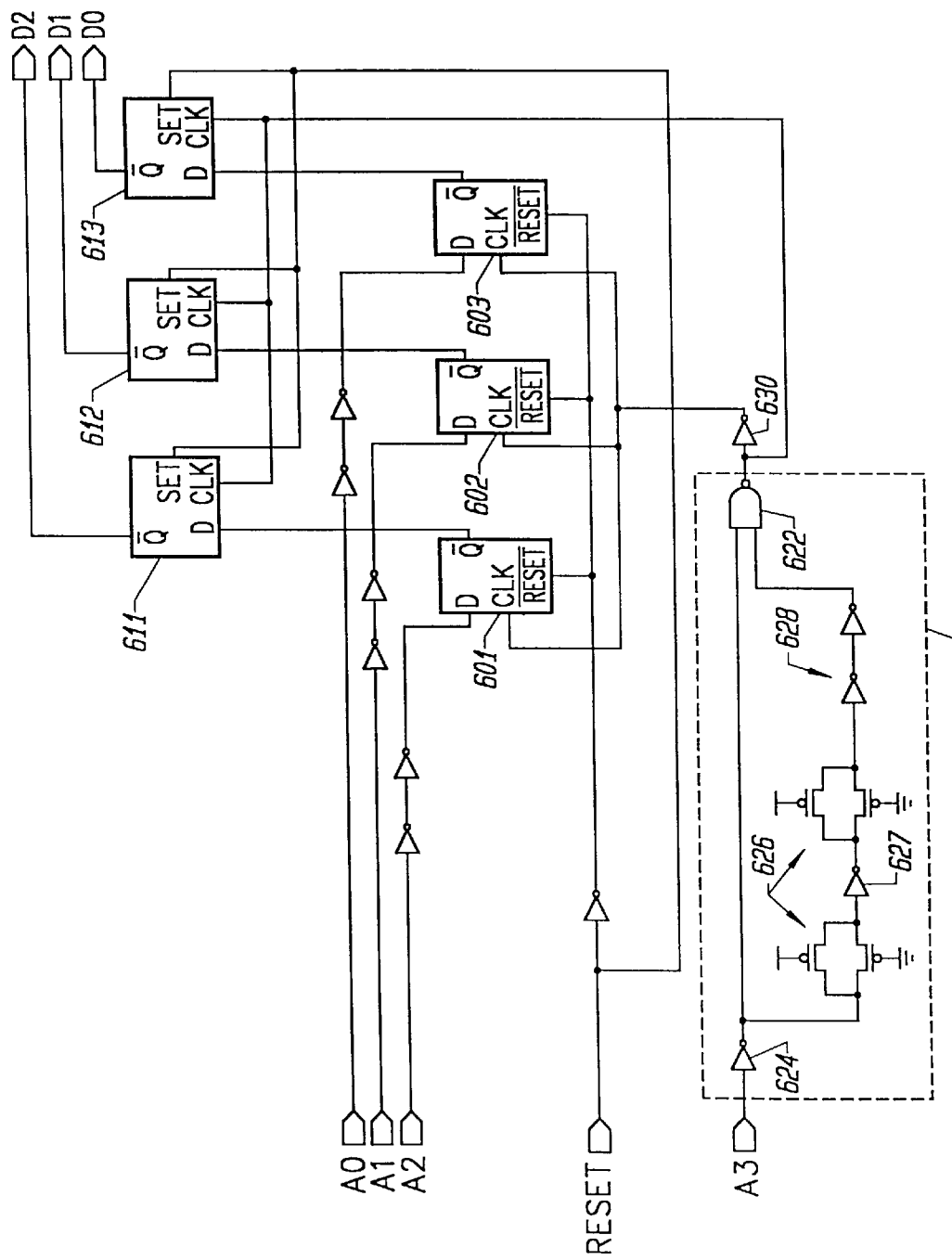
FIG. 6 shows a sample and hold circuit for the edge rate measurement circuit of FIG. 4.

Specific circuitry for the edge rate detection circuit 400 is shown in FIGS. 5 and 6 and includes an analog to digital (A/D) edge rate measurement circuit as shown in FIG. 5 and a sample and hold circuit as shown in FIG. 6.

The A/D edge rate measurement circuit of FIG. 5 includes a plurality of comparators 501–504, each having an inverting input connected to receive the signal VN. Outputs of comparators 501–504 are buffered through respective inverters 531–534 to provide respective output signals A3–A0. The signal VN is also provided to the gate and source of a transistor 510 and to one end terminal of first series connected resistors 512. The drain of transistor 510 is connected to $V_{DD}$. A second end terminal of the series resistors 512 is connected to a current sink 514.

The signal VP is provided to the gate and source of a transistor 520 and to one end terminal of second series connected resistors 522 having values substantially matching those of series resistors 512. The drain of transistor 520 is connected to $V_{DD}$, and a second end terminal of the series resistors 522 is connected to a current sink 524. Successive terminals of the series connected resistors 522, other than the first terminal are connected to the noninverting input of respective comparators 501–504.

In operation, with the signal VP and VN at zero volts, the output of comparators 501–504 will all be in a low state, providing a digital 0. However, when the signals VP and VN transition from zero volts, the comparator 501 output will go high to provide a digital 1, and will be followed by the outputs of comparators 502–504 going high at a rate depending on the rate of change of voltage with respect to time ($dV_{PN}/dt$) of the signal VP and VN.

As described with respect to FIG. 3, with a short cable, the rate $dV_{PN}/dt$ will be higher than with a longer cable, the rate $dV_{PN}/dt$ varying depending on cable length. With the states of outputs A0–A3 transitioning at a rate depending on the rate $dV_{PN}/dt$, the output signal A0–A3 provides a digital signal representing an estimation of the length of the cable providing the signals VN and VP.

The sample and hold circuit of FIG. 6 includes latches 601–603 receiving outputs A0–A2 buffered by inverters from the A/D edge rate measurement circuit of FIG. 5. The output of the latches 601–603 are provided to the inputs of latches 611–613, and the outputs of latches 611–613 provide the outputs D0–D2, or the signal D(2:0) output from the edge rate detection circuit 400 of FIG. 4. The reset signal (RST) is provided to the set input of latches 611–613 and to the reset inputs of latches 601–603 as shown.

The circuit of FIG. 6 also includes a pulse generator 620 receiving the output A3 from the circuit of FIG. 5. The pulse generator 620 functions to provide an output directly to the clock inputs of latches 611–613, and through an inverter 630 to the clock inputs CLK of latches 601–603 when a transition in the signal A3 occurs. With the clock inputs of latches 601–602 being inverted from the clock inputs CLK of latches 611–613, latches 601 and 611 form a D-type flip-flop, as do latches 602 and 612, and latches 603 and 613.

The pulse generator 620 includes an AND gate 622 having a first input connected by inverter 624 to receive the output A3. The signal from inverter 624 is further provided through delay elements 626 and inverter 627 to a second input of AND gate 622. Buffering 628 is also provided in the path between inverter 624 and the second input of AND gate 622 to compensate for buffering of the outputs A0–A2 to the input of latches 601–603. The delay through delay devices 626 and inverter 627 is adjusted to achieve a desired pulse period.

In operation, upon receiving a transition in the signal A3 which indicates that an edge of the signals VP and VN has been detected, the pulse generator 620 will provide a pulse of the desired pulse period. If the signals from outputs A0–A2 also transition within the pulse period, the D-type flip-flops (601,611) (602,612) and (603,613) will function to transition respective ones of the outputs D0–D2. With signals A0–A2 transitioning at a rate depending on the rate $dV_{PN}/dt$ of the signal VP and VN, with appropriate choice for the pulse period, the outputs D0–D2 will provide a digital signal representative of the cable length.

For example, with a short cable, the rate $dV_{PN}/dt$ will be very rapid so A0–A2 will all transition during a particular pulse period, so the outputs D0–D2 will be respectively: 1 1 1. With a longer cable, the rate $dV_{PN}/dt$ will be less rapid, enabling for instance only signals A0 and A1 to transition in the particular pulse period, so the outputs D0–D2 will be respectively: 1 1 0. Further with an even longer cable, the rate $dV_{PN}/dt$ may be even slower, enabling none of the signals A0–A2 to transition during the particular pulse period, so the outputs D0–D3 would be respectively: 0 0 0. As can be seen the outputs D0–D3 will provide a digital signal representative of the cable length.

Figure 7:
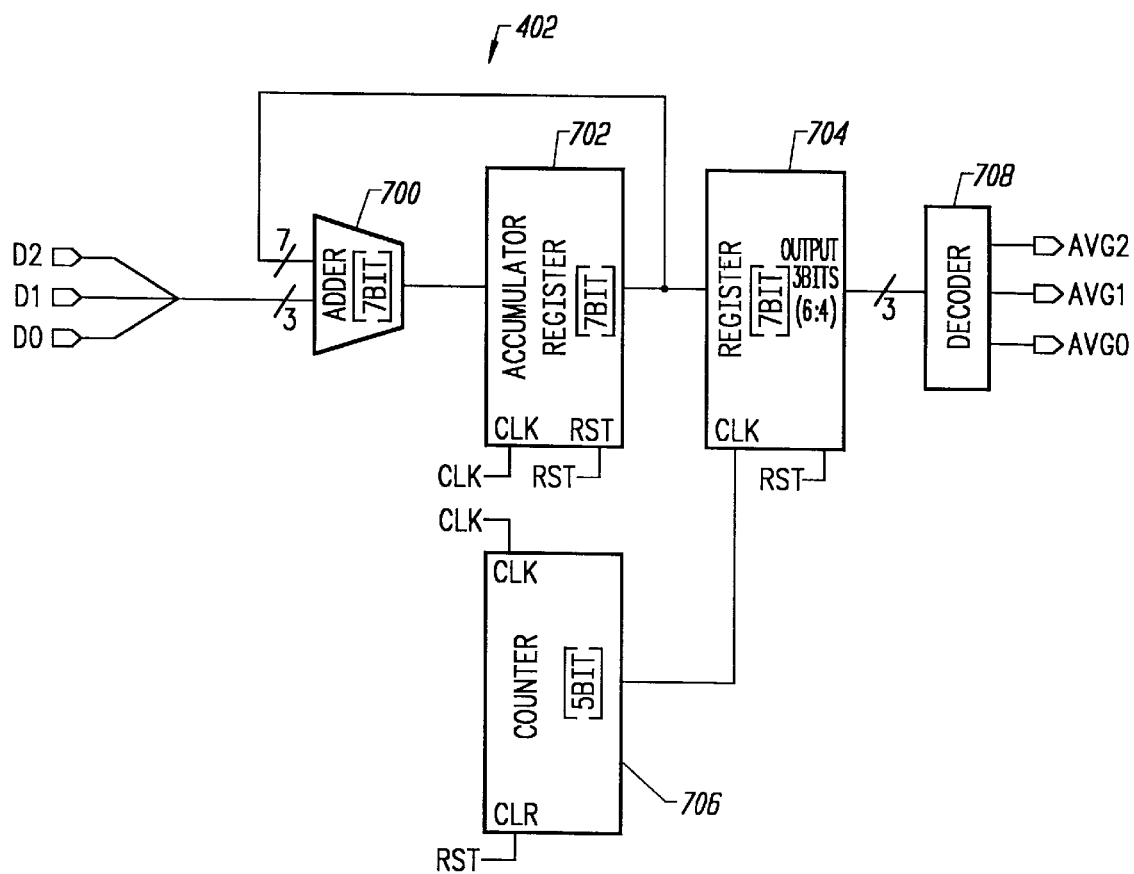
FIG. 7 shows circuitry for the digital averaging circuit of FIG. 4.

Although the outputs D0–D3 might be provided directly to the input of equalizer 108 as a digital cable length estimate, the equalizer needs a glitch free input to function properly. Glitches can result when variations in the signal VP and VN occur after the signal is provided through a cable. The present invention, therefore, utilizes a filter to effectively remove glitches from the output D0–D3. FIG. 7 shows circuitry for the digital averaging circuit 402 of FIG. 4 used in the present invention to filter the output D0–D3.

The digital averaging circuit includes an adder 700 having a first input receiving the three bits D0–D2, or D(2:0) from the edge rate detection circuit 400. The output of the adder 700 is provided to the input of an accumulator register 702. The accumulator register 702 also receives a clock signal (CLK) and a reset signal (RST) input to the digital averaging circuit 402. The output of the accumulator register 702 provides a second input to adder 700. For purposes of illustration, both the accumulator register 702 and adder 700 are shown as 7 bit devices.

The output of the accumulator register 702 is provided as the input of another register 704 which for illustration is shown to have 7 bits. A clock input to the register 704 is provided from a counter 706. The register 704 also receives the reset input (RST) provided to the digital averaging circuit. The output of register 704 is provided to a decoder 708.

The counter 706 receives the clock (CLK) and reset (RST) inputs and functions to count up to overflow, the overflow bit being provided to transition the clock input of register 704. The counter 706 is shown as a 5 bit device for purposes of illustration.

The decoder 708 receives only a number of the most significant bits, here the three most significant bits (6:4), from register 704 to simulate the function of a divider. For example, with the 3 most significant bits of 7 total bits taken from register 704, and with a 32 bit count indication provided by 5 bit counter 706, taking only the three most significant bits simulates the function of a divide by 32. In addition to effectively providing division, the decoder 708 functions to provide a signal AVG0–AVG2 as the output of the digital averaging circuit 402 decoded from its 3 bit input as controlled by a user.

In operation the circuit of FIG. 7 functions to add the values of outputs D0–D2 in adder 700 to the sum previously obtained from adder 700 and stored in accumulator 702 during a previous clock cycle. After 32 clock cycles, as determined by counter 706, the total value then stored in accumulator 702 will be stored in register 704 due to the clocking of register 704 by counter 706.

To take an average, the sum from register 704 is divided by the total number of clock cycles during which values for D0–D2 were summed. As described above, this is done by taking the three most significant bits (6:4) from register 704 to decoder 708. Thus, the digital value AVG(6:4) provided to decoder can be written as follows:

$$AVG(6:4) = \frac{\sum_{i=0}^{N-1}(D0 - D2)(i)}{N}$$

To initialize the count value of counter 706, accumulator 702 and register 704, the reset signal will be strobed upon startup. The accumulator register 702 can also be initialized after each clocking of register 704 to calculate a new sum of values from adder 700 for the next 32 clock cycles by coupling the reset of accumulator 702 to the output of counter 706. However, the count value of register 702 can also not be reset so that the sum from adder 700 is added to a previous sum determined during a past 32 clock cycles.

The decoder 708 is controlled to assure the output AVG0–AVG2 when provided to the control input of the equalizer 108 of FIG. 1 causes the equalizer to function in a stable manner. For instance, the decoder can be rolled to provide an output value AVG0–AVG2 of 0 0 1 when its input receives the values 0 0 0, 0 0 1, or 0 1 0, an output value AVG0–AVG2 of 0 1 0 when its input receives values 0 1 1, 1 0 0, or 1 0 1, and an output value AVG0–AVG2 for remaining input values. By so controlling the decoder, the output value AVG0–AVG2 will not continually transition due to minor measurement differences.

Figure 8:
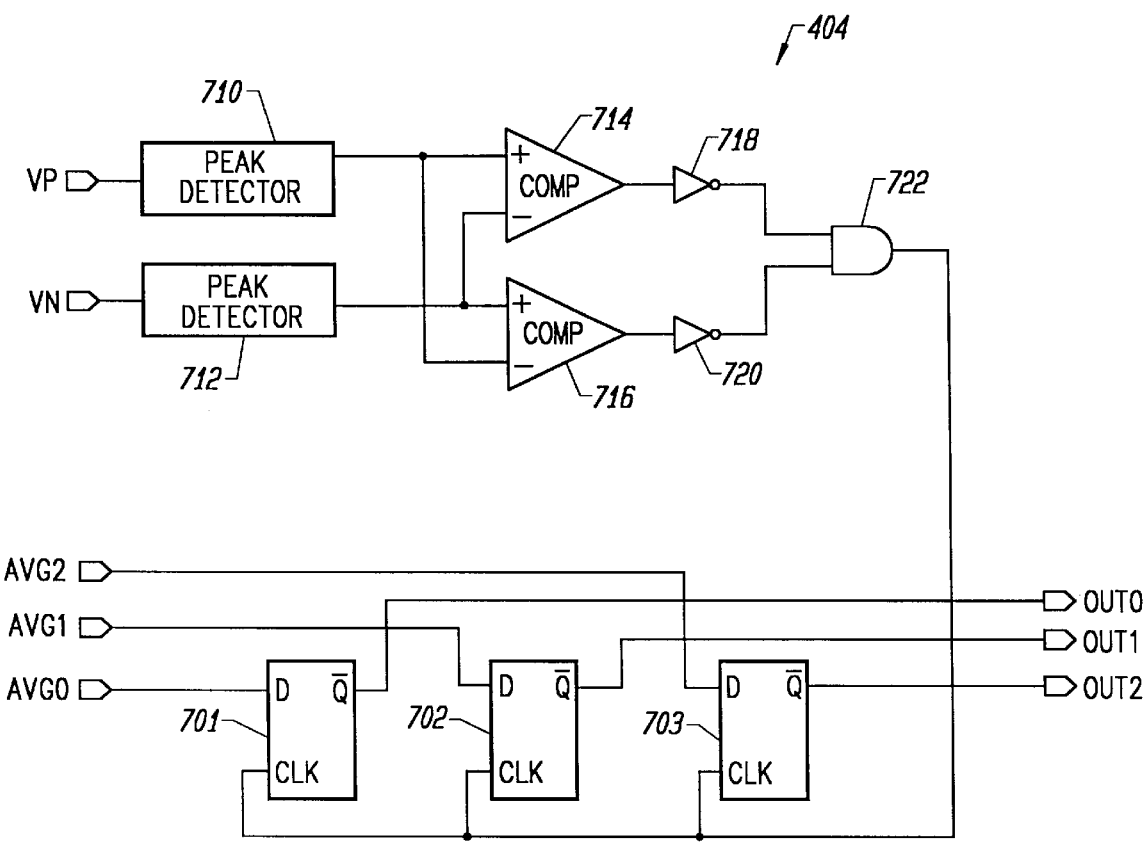
FIG. 8 shows circuitry for the baseline wander detection circuit of FIG. 4.

Although the signals AVG0–AVG2, or AVG(0:2) as shown in FIG. 4 from the digital averaging circuit 402, can be provided directly to the input of the digital averaging circuit, the present invention further provides circuitry to eliminate the effect of baseline wander in the differential signal VP and VN. FIG. 8 shows circuitry for the baseline wander detection circuit 404 of FIG. 4 for the present invention.

The baseline wander detection circuit 404 of FIG. 8 includes latches 701–703 having inputs receiving respective output signals AVG2–AVG0 from the digital averaging circuit 402, and outputs providing respective signals OUT0–OUT2. The signals OUT0–OUT2 provide the digital control signal input to equalizer 108 of FIG. 1.

The circuit of FIG. 8 also includes a circuit for indicating baseline wander including a first peak detector 710 receiving the signal portion VP, and a second peak detector 712 receiving the signal portion VN. The output of peak detector 710 is provided to the noninverting input of a comparator 714 and to the inverting input of a comparator 716. The output of peak detector 712 is provided to the inverting input of comparator 714 and to the noninverting input of comparator 716. The output of comparator 714 is provided through an inverter 718 to one input of an AND gate 722, while the output of comparator 716 is provided though an inverter 720 to a second input of an AND gate 722. The output of the AND gate 722 is then provided to the clock inputs of latches 701–703.

In operation, baseline wander is detected when the peak value of MLT-3 signal portion VP, referring to FIG. 3, is not equal to the peak value of the signal portion VN. Thus, if baseline wander occurs, the outputs of peak detectors 710 and 712 will vary more than a given amount. The comparators 714 and 716 are, thus, designed to provide equal outputs when the outputs of peak detectors 710 and 712 are substantially equal so that the output of AND gate 722 will be high, but when the outputs of peak detectors 710 and 712 vary more than the given amount, the outputs of comparators 714 and 716 are designed to provided opposite outputs so that the output of AND gate 722 will be low. With the output of AND gate 722 high, indicating no baseline wander has occurred, latches 701–703 will provide the signals AVG2–AVG0 directly as outputs OUT0–OUT2. However, when baseline wander is detected, latches will be disabled to effectively latch a previous value of AVG2–AVG0 as signals OUT0–OUT2.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A transmission line length estimation circuit for receiving an input signal provided through a transmission line and for providing a digital control signal to an equalizer, the equalizer also for receiving the input signal from the transmission line and restoring amplitude loss and phase delay to the input signal resulting from the transmission line based on the digital control signal, the transmission line length determination circuit comprising:

an edge rate detection circuit comprising:
      an analog to digital (A/D) edge rate measurement circuit for receiving the input signal, and generating first digital signals representative of a rate of change in voltage with respect to time of the input signal at an output; and
      a sample and hold circuit having an input connected to the output of the A/D edge rate measurement circuit for receiving the digital signals from the A/D edge rate measurement circuit and providing second digital signals at an output for the edge rate detection circuit indicating the state of the first digital signals during transitions of the input signal, the output of the edge rate detection circuit being coupled to provide the digital control signal to the equalizer.

2. The transmission line length estimation circuit of claim 1 further comprising:
   a digital averaging circuit having an input connected to the output of the edge rate detection circuit for receiving the second digital signals, and having an output providing an average digital signal representative of an average value for the second digital signals received during a number of the transitions of the input signal, the output of the digital averaging circuit being coupled to provide the digital control signal to the equalizer.

3. The transmission line length estimation circuit of claim 2 further comprising:
   a baseline wander detection circuit comprising:
      latches for coupling the output of the digital averaging circuit to provide the digital control signal to the equalizer; and
      baseline wander indication circuitry receiving the input signal at differential inputs and generating a baseline wander indication signal when a difference in voltage magnitude between the differential inputs varies greater than a desired amount, the base line wander indication signal being coupled to clock inputs of the latches so that the latches maintain a state of the digital average signal as received before the baseline wander indication signal was generated.

4. The transmission line length estimation circuit of claim 1, wherein the input signal is a differential signal having a positive signal component (VP) and a negative signal component (VN),
   wherein the A/D edge rate measure edge rate measurement circuit comprises:
      a plurality of comparators having inverting terminals connected to receive the signal VN;
      a first plurality of series connected resistors having a first end connected to receive the signal VN, and having a second end coupled to a current sink; and
      a second plurality of series connected resistors having a first end terminal connected to receive the signal VP, and having a second end terminal coupled to a current sink, wherein successive terminals of the second plurality of series connected transistors, other than the first end terminal, are each connected to a non-inverting input of a respective one of the comparators,
   and wherein the sample and hold circuit comprises:
      a pulse generator having an input coupled to an output of a first comparator in the plurality of comparators; and
      a plurality of flip-flops, each having an input coupled to an output of a respective one of the comparators, a clock input coupled to the output of the pulse generator, and an output, wherein the outputs of the plurality of flip-flops provide the output of the edge rate detection circuit.

5. The transmission line length estimation circuit of claim 4, wherein the pulse generator comprises:
   a NAND gate having a first input coupled to receive the output of the first comparator in the plurality of comparators, a second input, and an output coupled to the clock inputs of the plurality of flip-flops; and
   a series connected delay element and inverter having a first end terminal coupled to receive the output of the first comparator in the plurality of comparators, and a second end terminal coupled to a second input of the NAND gate.

6. The transmission line length estimation circuit of claim 2 wherein the digital averaging circuit comprises:

an adder having a first input coupled to receive the digital signal from the output of the edge rate detection circuit, a second input, and an output providing the sum of its first and second input;

a first register having an input connected to the output of the adder, a clock input receiving a clock signal, and an output connected to the second input of the adder;

a counter having an input connected to receive the clock signal, and an output providing a signal transition when its count value reaches a desired number; and a second register having an input connected to the output of the first register, a clock input connected to the output of the counter, and an output coupled to provide the digital control signal to the equalizer.

7. The transmission line length estimation circuit of claim 6 wherein the digital averaging circuit further comprises:

a decoder having an input connected to receive a number of bits of a signal from the output of the second register, the decoder providing a signal at an output representative of a state of the number of bits, the output of the decoder being coupled to provide the digital control signal to the equalizer.

8. The transmission line length estimation circuit of claim 3, wherein the input signal is a differential signal having a positive signal component (VP) and a negative signal component (VN), and wherein the baseline wander indication circuitry comprises:

a first peak detector having an input connected to receive the signal VP, and an output;

a second peak detector having an input connected to receive the signal VN, and an output;

a first comparator having a noninverting input connected to the output of the first peak detector and an inverting input connected to the output of the second peak detector;

a second comparator having an inverting input connected to the output of the first peak detector and a noninverting input connected to the output of the second peak detector; and an AND gate having a first input coupled by an inverter to the output of the first comparator and having, a second input coupled by an inverter to the output of the second comparator, and having an output coupled to the clock inputs of the latches.

* * * * *